US011256406B2

(12) United States Patent
Omori

(10) Patent No.: US 11,256,406 B2
(45) Date of Patent: Feb. 22, 2022

(54) PROCESSING APPARATUS

(71) Applicant: DISCO CORPORATION, Tokyo (JP)

(72) Inventor: Takafumi Omori, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/943,181

(22) Filed: Jul. 30, 2020

(65) Prior Publication Data

US 2021/0034228 A1 Feb. 4, 2021

(30) Foreign Application Priority Data

Aug. 1, 2019 (JP) .............................. JP2019-141905

(51) Int. Cl.
| | | |
|---|---|---|
| *G06F 3/0484* | (2013.01) |
| *G06F 3/04847* | (2022.01) |
| *G06F 3/04883* | (2022.01) |
| *G06F 3/0481* | (2022.01) |
| *G06F 3/041* | (2006.01) |
| *G06F 40/166* | (2020.01) |

(52) U.S. Cl.
CPC .......... *G06F 3/04847* (2013.01); *G06F 3/041* (2013.01); *G06F 3/0481* (2013.01); *G06F 3/04883* (2013.01); *G06F 40/166* (2020.01)

(58) Field of Classification Search
CPC .... G06F 3/04847; G06F 3/041; G06F 3/0481; G06F 3/04883
See application file for complete search history.

(56) References Cited

U.S. PATENT DOCUMENTS

| | | | |
|---|---|---|---|
| 7,761,814 B2* | 7/2010 | Rimas-Ribikauskas ..................... G06F 3/017 |
| | | | 715/863 |
| 9,116,872 B1* | 8/2015 | Channakeshava .. G06F 16/9535 |
| 10,061,293 B2* | 8/2018 | Kubo ................... G05B 19/402 |
| 10,131,444 B1* | 11/2018 | Toews ................. G06F 3/04895 |
| 10,153,836 B2* | 12/2018 | Sekiya .................... H01L 21/67 |

(Continued)

FOREIGN PATENT DOCUMENTS

| | | |
|---|---|---|
| JP | 05002207 | 1/1993 |
| JP | 11259124 A | 9/1999 |

(Continued)

OTHER PUBLICATIONS

Singapore App. 10202006729X: Search Report and Written Opinion (translation) dated May 25, 2021 (4 pages).

*Primary Examiner* — Shen Shiau
(74) *Attorney, Agent, or Firm* — Greer, Burns & Crain, Ltd.

(57) ABSTRACT

A processing apparatus includes a chuck table for holding a workpiece thereon, a processing unit for processing the workpiece held on the chuck table, a touch panel for entering processing conditions, and a control unit for controlling the touch panel. The control unit controls the touch panel to display a plurality of input fields corresponding to a plurality of items included in the processing conditions, and controls the touch panel to display a copy processing key and a paste processing key when one of the input fields is selected. The control unit copies information entered in the selected one of the input fields when the copy processing key is selected, and enters information that has been copied in advance into the selected one of the input fields when the paste processing key is selected.

5 Claims, 5 Drawing Sheets

(56) References Cited

U.S. PATENT DOCUMENTS

| | | | |
|---|---|---|---|
| 10,241,751 B2* | 3/2019 | Kang | G06F 3/167 |
| 10,773,410 B2* | 9/2020 | Komatsu | B26D 3/065 |
| 10,816,952 B2* | 10/2020 | Miyata | G06F 3/04886 |
| 2006/0055662 A1* | 3/2006 | Rimas-Ribikauskas | G06F 3/04883 |
| | | | 345/156 |
| 2006/0059247 A1* | 3/2006 | Marappan | G06F 40/174 |
| | | | 709/219 |
| 2007/0050469 A1* | 3/2007 | Gupta | G06F 9/451 |
| | | | 709/217 |
| 2010/0235770 A1 | 9/2010 | Ording et al. | |
| 2015/0212707 A1* | 7/2015 | Norwood | G06F 40/166 |
| | | | 715/773 |
| 2016/0091887 A1* | 3/2016 | Kubo | G05B 15/02 |
| | | | 700/114 |
| 2016/0224217 A1* | 8/2016 | Kim | G06F 3/0236 |
| 2016/0297091 A1* | 10/2016 | Komatsu | H01L 21/78 |
| 2017/0102846 A1* | 4/2017 | Ebler | G06F 3/04847 |
| 2017/0249059 A1* | 8/2017 | Houseworth | G06F 16/2428 |
| 2018/0097564 A1* | 4/2018 | Sekiya | H01L 21/67276 |
| 2019/0271962 A1* | 9/2019 | Miyata | G06F 3/04886 |

FOREIGN PATENT DOCUMENTS

| | | |
|---|---|---|
| JP | 2009117776 A | 5/2009 |
| JP | 2015141688 A | 8/2015 |
| JP | 2018206240 A | 12/2018 |
| JP | 2019067245 A | 4/2019 |
| KR | 20140095268 A | 8/2014 |

* cited by examiner

PROCESSING APPARATUS

BACKGROUND OF THE INVENTION

Field of the Invention

The present invention relates to a processing apparatus that includes a touch panel for entering processing conditions.

Description of the Related Art

Semiconductor wafers with a plurality of devices such as integrated circuits (ICs), or large-scale-integration (LSI) circuits formed thereon are divided into a plurality of semiconductor device chips having those devices. Furthermore, a plurality of semiconductor device chips mounted on a substrate are covered with a sealing material of resin, i.e., molding resin, to produce a packaged substrate, which is then divided into a plurality of packaged devices.

Semiconductor wafers and packaged substrates are divided by a cutting apparatus, for example. The cutting apparatus includes a chuck table for holding a workpiece thereon and a cutting unit in which there is mounted an annular cutting blade for cutting the workpiece on the chuck table. The cutting blade is caused to cut into the workpiece held on the chuck table, cutting and dividing the workpiece. In recent years, semiconductor device chips and packaged devices have been required to be thinner to meet demands for smaller and thinner electronic devices incorporating such semiconductor device chips and packaged devices. There has thus been used a process for grinding and thinning semiconductor wafers and packaged substrates before they are divided. Semiconductor device chips and packaged devices are thinned by a grinding apparatus that grinds a workpiece with grinding stones, for example.

Some processing apparatuses such as a cutting apparatus, or a grinding apparatus include a touch panel as a user interface. The touch panel displays a control screen for controlling the processing apparatus, an image of the workpiece that is being processed, and other images. The operator of the processing apparatus operates the touch panel to enter processing conditions, etc. into the processing apparatus (see, for example, Japanese Patent Laid-open No. 2009-117776).

SUMMARY OF THE INVENTION

For establishing processing conditions for a processing apparatus having a touch panel, the operator operates the touch panel to enter the processing conditions into the processing apparatus. Specifically, the operator touches input keys included in an input area, i.e., a ten-key pad, a keyboard, etc., displayed on the touch panel to enter desired information, i.e., numerical values, character strings, etc., into the processing apparatus. However, in case the input keys displayed on the touch panel are arranged closely at small spaced intervals, for example, the operator tends to make input mistakes when frequently entering information by touching the input keys. In addition, providing the number of digits representing a numerical value to be entered or the number of characters of a character string to be entered is large, the operator may enter wrong information. Once wrong information is entered through the touch panel, the workpiece may be processed under unintended processing conditions, possibly resulting in a processing failure.

Processing conditions to be entered into the processing apparatus include a plurality of items. For example, processing conditions for a cutting apparatus that cuts a workpiece with a cutting blade include items representing the rotational speed of the cutting blade, the depth to which the cutting blade cuts into the workpiece, the processing feed speed, etc. Values of these items are independently set depending on processing details. Moreover, the cutting apparatus has a plurality of processing conditions stored therein for a plurality of types of workpieces. When processing conditions are to be set, a plurality of items thereof may be set to identical values. For example, a cutting apparatus of what is called a facing dual-spindle type where cutting blades are disposed in facing relation to each other may have rotational speeds set to identical values and cutting depths set to identical values, for the cutting blades. In addition, only particular items, e.g., items representing processing feed speed, etc., among a plurality of processing conditions stored in the cutting apparatus may be changed similarly. In such a case, the operator needs to operate the touch panel of the cutting apparatus to repeatedly enter identical operation into a plurality of input fields displayed on the touch panel. It is tedious and time-consuming to set processing conditions, resulting in a reduction in working efficiency.

The present invention has been made in view of the above problems. It is an object of the present invention to provide a processing apparatus that is capable of entering processing conditions simply and accurately.

In accordance with an aspect of the present invention, there is provided a processing apparatus including a chuck table for holding a workpiece thereon, a processing unit for processing the workpiece held on the chuck table, a touch panel for entering processing conditions, and a control unit for controlling the touch panel, in which the control unit controls the touch panel to display a plurality of input fields corresponding to a plurality of items included in the processing conditions, controls the touch panel to display a copy processing key and a paste processing key when one of the input fields is selected, copies information entered in the selected one of the input fields when the copy processing key is selected, and enters information that has been copied in advance into the selected one of the input fields when the paste processing key is selected.

Preferably, the control unit controls the touch panel to display a transcription processing key when the one of the input fields is selected, and enters information entered in the selected one of the input fields into another one of the input fields when the transcription processing key is selected. Preferably, the control unit controls the touch panel to display an input section including a plurality of input keys used to enter information into the plurality of input fields and an information input field, the input section also functioning as a calculator, and enters information entered in the selected one of the input fields into the information input field when the copy processing key is selected with the one of the input keys being selected and the paste processing key is thereafter selected with the information input field being selected. Preferably, the control unit controls the touch panel to display an input section including a plurality of input keys used to enter information into the plurality of input fields and an information input field, the input section also functioning as a calculator, and enters information entered in the selected one of the input fields into the information input field when the transcription processing key is selected. Preferably, the control unit controls the touch panel to further display one or more history transcription processing keys for displaying information previously entered in the one of the input fields when the one of the input fields is selected, and enters information displayed in one of the history transcription processing keys into the selected one of the input fields when the one of the history transcription processing keys is selected. Preferably, the copy processing key and the paste processing key are selected by a flicking action.

With the processing apparatus according to the present invention, when one of the input fields displayed on the touch panel is selected, the copy processing key and the paste processing key are displayed on the touch panel. When the copy processing key and the paste processing key are selected, information can be entered into one of the input fields by a copying process and a pasting process. Processing conditions can thus simply and accurately be entered into the processing apparatus.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
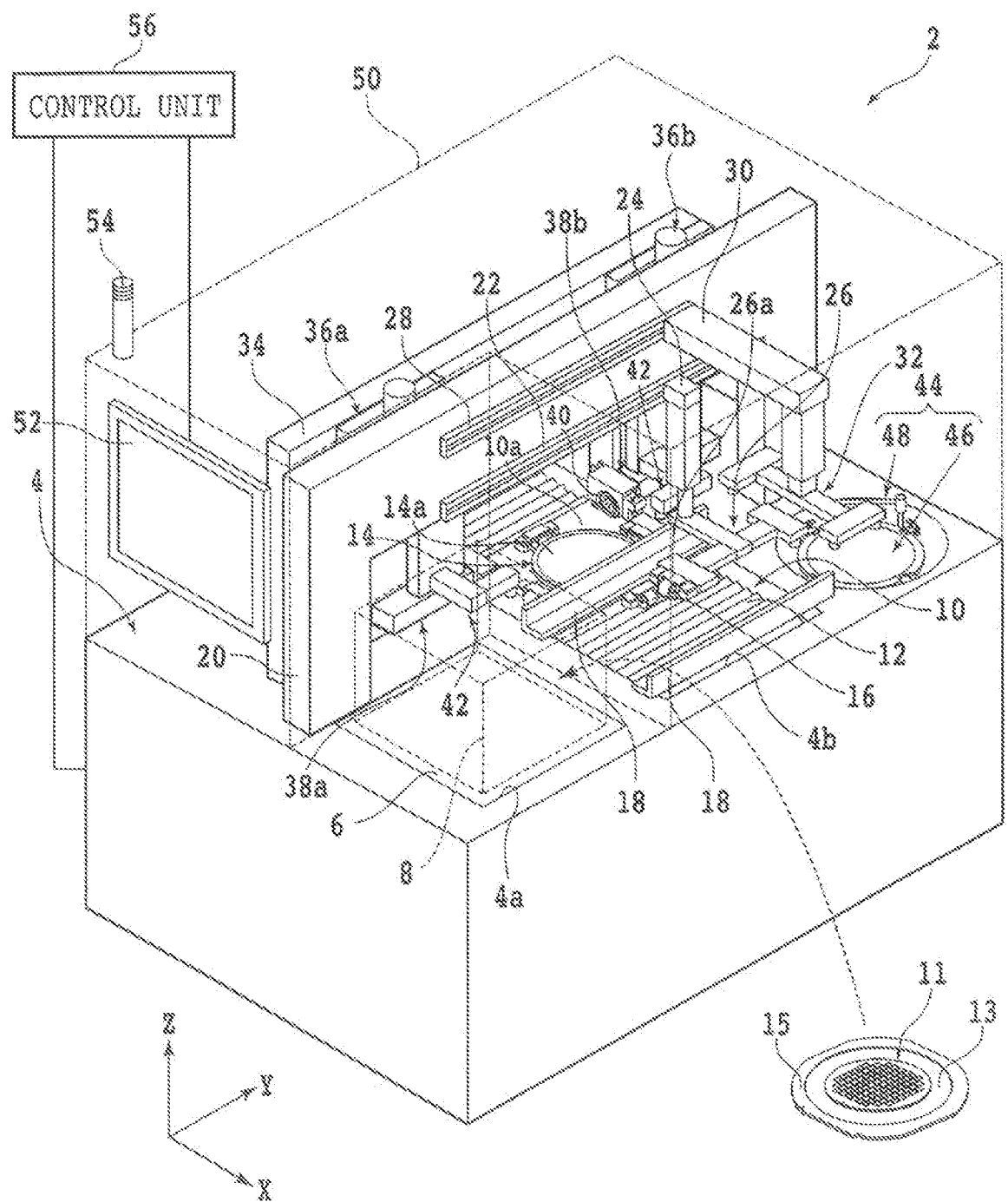
FIG. 1 is a perspective view of a processing apparatus according to an embodiment of the present invention.

A preferred embodiment of the present invention will hereinafter be described below with reference to the accompanying drawings. First, a configurational example of a processing apparatus according to the preferred embodiment will be described below. FIG. 1 illustrates the processing apparatus, denoted by 2, in perspective. According to the preferred embodiment, the processing apparatus 2 is a cutting apparatus for cutting a workpiece 11.

The processing apparatus 2 includes a base 4 that supports various components thereof. The base 4 has an opening 4a defined therein at a corner of a front portion thereof and having an upper end that is open at an upper surface of the base 4. The opening 4a houses therein a cassette holder base 6 that is vertically movable by a lifting and lowering mechanism, not illustrated. A cassette 8 capable of housing a plurality of workpieces 11 therein is placed on the cassette holder base 6. In FIG. 1, the cassette 8 has an outer profile indicated by the broken lines.

Each of the workpieces 11 is a silicon wafer in the shape of a disk, for example. The workpiece 11 has a face side demarcated into a plurality of areas by a plurality of projected dicing lines or streets arrayed as a grid of intersecting lines, with devices such as ICs, or LSI circuits formed in the respective areas. When the processing apparatus 2 operates, it divides the workpiece 11 along the projected dicing lines into a plurality of device chips including those devices, respectively.

A circular tape 13 made of resin or the like and larger in diameter than the workpiece 11 is affixed to a reverse side of the workpiece 11. An annular frame 15 having a central circular opening larger in diameter than the workpiece 11 is affixed to an outer circumferential portion of the tape 13. The workpiece 11 that is supported on the frame 15 by the tape 13 is housed in the cassette 8. The workpiece 11 is not limited to any particular material, shape, structure, size, etc. The workpiece 11 may be a wafer made of a material other than silicon, such as a semiconductor, ceramics, resin, or metal. The devices formed on the workpiece 11 are not limited to any particular type, quantity, shape, structure, size, layout, etc. The workpiece 11 may even be free of devices. The workpiece 11 may not be supported on the frame 15, or the tape 13 may not be affixed to the workpiece 11, when the workpiece 11 is housed in the cassette 8. Further alternatively, the workpiece 11 may be a packaged substrate such as a chip size package (CSP) substrate, or a quad flat non-leaded (QFN) package substrate.

A rectangular opening 4b is defined laterally of the opening 4a in the base 4 and has an upper end that is open at the upper surface of the base 4. The rectangular opening 4b has longitudinal directions extending along X-axis directions, i.e., forward and rearward directions or processing feed directions. The opening 4b houses therein a ball-screw-type moving mechanism 10 and a dust-proof, drip-proof cover 12 that covers part of the moving mechanism 10. The moving mechanism 10 includes a moving table 10a and moves the movable table 10a along the X-axis directions.

A chuck table, i.e., a holding table, 14 for holding the workpiece 11 thereon is mounted on the movable table 10a. The chuck table 14 has an upper surface as a holding surface 14a for holding the workpiece 11 thereon. The holding surface 14a is connected to a suction source, not illustrated, such as an ejector or the like through a suction channel, not illustrated, defined in the chuck table 14. The chuck table 14 is moved, i.e., processing-fed, along the X-axis directions by the moving mechanism 10. The chuck table 14 is also connected to a rotary actuator, not illustrated, such as an electric motor, and is rotatable about a rotational axis generally parallel to Z-axis directions, i.e., vertical directions, and perpendicular to the X-axis directions. A plurality of clamps 16 for gripping and securing the frame 15 that supports the workpiece 11 are disposed around the chuck table 14.

A pair of guide rails 18 is disposed above the opening 4b. The guide rails 18 are movable toward and away from each other while being kept generally parallel to Y-axis directions, i.e., leftward and rightward directions or indexing feed directions, perpendicular to the X-axis directions and the Z-axis directions. Each of the guide rails 18 has a support surface for supporting the frame 15 from below and a side surface extending generally perpendicularly to the support surface, for contacting an outer side edge of the frame 15. The guide rails 18 sandwich the frame 15 therebetween along the X-axis directions to position the workpiece 11.

A portal-shaped first support structure 20 is disposed on the base 4 across and over the opening 4b. A rail 22 extending in the Y-axis directions is fixed to a front surface, facing the guide rails 18, of the first support structure 20. A holding unit 26 is operatively coupled to the rail 22 by a moving mechanism 24.

The holding unit 26 contacts an upper surface of a frame 15 and holds the frame 15 under suction. The holding unit 26 is vertically movable and also movable in the Y-axis directions along the rail 22 by the moving mechanism 24. The holding unit 26 holds the frame 15 under suction that has been positioned by the pair of guide rails 18, and delivers the workpiece 11 to the chuck table 14. The holding unit 26 includes, on its side closer to the opening 4a, a gripping mechanism 26a for griping the frame 15. The gripping mechanism 26a grips a frame 15 supporting a workpiece 11 that is housed in the cassette 8, and then the holding unit 26 is moved in one of the Y-axis directions to cause the gripping mechanism 26a to pull the gripped frame 15 out of the cassette 8 onto the guide rails 18. On the other hand, while a frame 15 supporting a workpiece 11 on the guide rails 18 is being gripped by the gripping mechanism 26a, the holding unit 26 is moved in the other of the Y-axis directions to cause the gripping mechanism 26a to put the gripped frame 15 back into the cassette 8.

A rail 28 extending in the Y-axis directions is fixed to the front surface of the first support structure 20 above and parallel to the rail 22. A holding unit 32 is operatively coupled to the rail 28 by a moving mechanism 30. The holding unit 32 contacts an upper surface of a frame 15 and holds the frame 15 under suction. The holding unit 32 is vertically movable and also movable in the Y-axis directions along the rail 28 by the moving mechanism 30.

Behind the first support structure 20, there is disposed a portal-shaped second support structure 34 on the base 4 across and over the opening 4b. A pair of ball-screw-type moving mechanisms 36a and 36b is fixed to respective side end portions of a front surface of the second support structure 34 that faces the first support structure 20. A processing unit 38a is fixed to a lower portion of the moving mechanism 36a, and a processing unit 38b is fixed to a lower portion of the moving mechanism 36b. According to the present embodiment, the processing units 38a and 38b are cutting units for cutting a workpiece 11 with respective annular cutting blades 40. When the moving unit 36a moves the processing unit 38a in the Y-axis directions and the Z-axis directions, the processing unit 38a is positionally adjusted in the Y-axis directions and the Z-axis directions. When the moving unit 36b moves the processing unit 38b in the Y-axis directions and the Z-axis directions, the processing unit 38b is positionally adjusted in the Y-axis directions and the Z-axis directions.

Each of the processing units 38a and 38b includes a tubular housing that houses a tubular spindle, not illustrated, therein. The spindle has a distal end portion, i.e., an end portion, exposed out of the housing and a proximal end portion, i.e., another end portion, coupled to a rotary actuator, not illustrated, such as an electric motor for rotating the spindle about its own axis. The annular cutting blade 40 is mounted on the distal end of the spindle.

The cutting blade 40 is a cutting tool for cutting into the workpiece 11 to cut the workpiece 11. The cutting blade 40 is made of abrasive grains of diamond or the like that are bound together by a bonding material. The cutting blade 40 may be an electroformed hub blade including a cutting edge of abrasive grains bound together by nickel plating or the like, or an annular blade, i.e., a washer blade, including a cutting edge of abrasive grains of metal, ceramics, resin, or the like bound together by a bonding material. The abrasive grains and the binder of the cutting blade are not limited to any particular materials and may be selected depending on the material of the workpiece 11, the details of the cutting process performed on the workpiece 11, etc.

Image capturing units, i.e., cameras, 42 for capturing images of the workpiece 11 or the like held on the chuck table 14 are disposed in respective positions adjacent to the processing units 38a and 38b. Images captured by the image capturing units 42 are used in positionally aligning the workpiece 11 held on the chuck table 14 with the processing units 38a and 38b, for example.

The workpiece 11 is placed on the chuck table 14 with the tape 13 interposed therebetween, and the frame 15 is secured in place by the clamps 16. A negative pressure from the suction source acts on the holding surface 14a, holding the workpiece 11 under suction on the chuck table 14 with the tape 13 interposed therebetween. Then, while supplying a cutting fluid to the workpiece 11, the cutting blade 40 mounted on the processing unit 38a or the processing unit 38b is rotated and caused to cut into the workpiece 11, thereby cutting the workpiece 11. In FIG. 1, the processing apparatus 2 is illustrated as a cutting apparatus of the facing dual-spindle type where the two processing units 38a and 38b are disposed to orient their cutting blades 40 in facing relation to each other. However, according to the present invention, the processing apparatus 2 may have a single processing unit.

The processing apparatus 2 also includes a cleaning unit 44 disposed laterally of the opening 4b remotely from the opening 4a. The cleaning unit 44 includes a spinner table 46 for holding a workpiece 11 in a tubular cleaning space. The spinner table 46 is coupled to a rotary actuator, not illustrated, for rotating the spinner table 46 about its own axis at a predetermined speed. A nozzle 48 for supplying a cleaning fluid, e.g., a mixture fluid of water and air, onto the workpiece 11 held on the spinner table 46 is disposed above the spinner table 46. The workpiece 11 held on the spinner table 46 is cleaned by the cleaning fluid supplied from the nozzle 48 to the workpiece 11 while the spinner table 46 that is holding the workpiece 11 thereon is being rotated.

After the workpiece 11 has been processed by the processing units 38a and 38b, the workpiece 11 is delivered to the cleaning unit 44 by the holding unit 32 and cleaned by the cleaning unit 44. Then, the workpiece 11 is delivered onto the guide rails 18 by the holding unit 26. The workpiece 11 is positioned by the guide rails 18, and then, the holding unit 26 grips the frame 15 with the gripping mechanism 26a and places the workpiece 11 into the cassette 8.

A cover 50 is disposed on the base 4 in covering relation to the components of the processing apparatus 2. In FIG. 1, the cover 50 has an outer profile indicated by the broken lines. A touch panel 52 as a user interface is mounted on a side surface of the cover 50. The touch panel 52 functions as a display unit, i.e., a display device, for displaying certain information and also as an input unit, i.e., an input device, for entering information into the processing apparatus 2. A warning lamp 54 is mounted on an upper surface of the cover 50. When the processing apparatus 2 malfunctions, for example, the warning lamp 54 comes on or blinks, letting the operator know the malfunction.

The various components of the processing apparatus 2, i.e., the cassette holder base 6, the moving mechanism 10, the chuck table 14, the clamps 16, the guide rails 18, the moving mechanism 24, the holding unit 26, the moving mechanism 30, the holding unit 32, the moving mechanisms 36a and 36b, the processing units 38a and 38b, the image capturing unit 42, the cleaning unit 44, the touch panel 52, the warning lamp 54, etc., are electrically connected to a control unit, i.e., a controller, 56. The control unit 56 is constructed as a computer or the like and controls operation of the various components of the processing apparatus 2.

For processing a workpiece 11 on the processing apparatus 2, processing conditions are determined and entered into the processing apparatus 2. Specifically, the operator of the processing apparatus 2 enters the processing conditions into the processing apparatus 2 by operating the touch panel 52. More specifically, the touch panel 52 displays a screen for setting processing conditions, i.e., a processing condition setting screen, and the operator touches the touch panel 52 to enter processing conditions while referring to the displayed processing condition setting screen.

Figure 2:
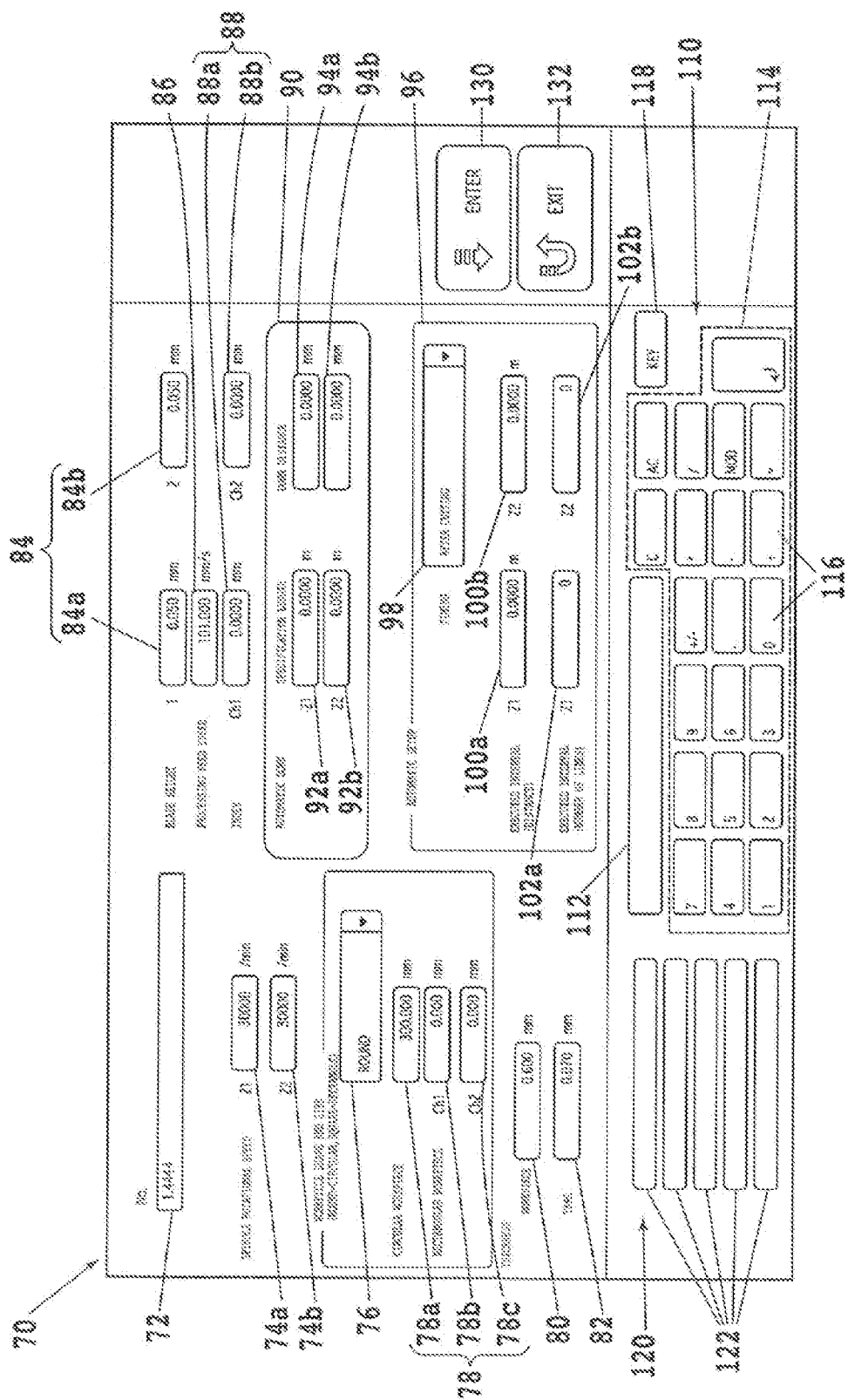
FIG. 2 is a view of a processing condition setting screen displayed on a touch panel of the processing apparatus.

FIG. 2 illustrates a processing condition setting screen 70 displayed on the touch panel 52. For setting processing conditions for the processing apparatus 2, the control unit 56 (see FIG. 1) controls the touch panel 52 to display the processing condition setting screen 70. The processing condition setting screen 70 includes a plurality of items included in processing conditions. The processing condition setting screen 70 also includes a plurality of input fields corresponding respectively to the items included in processing conditions. The operator enters information, i.e., numerical values, character strings, etc., indicating details of the items of the processing conditions, into the input fields.

Specifically, the processing condition setting screen 70 includes in a left area thereof an input field, i.e., a name input field, 72 for entering and displaying a processing condition name, i.e., a data name, input fields, i.e., rotational speed input fields, 74a and 74b for entering and displaying rotational speeds of the spindles of the processing units 38a and 38b, i.e., rotational speeds of the cutting blades 40 mounted on the processing units 38a and 38b, an input field, i.e., a shape input field, 76 for entering and displaying the shape of the workpiece 11, an input field, i.e., a size input field, 78 for entering and displaying the size of the workpiece 11, an input field, i.e., a workpiece thickness input field, 80 for entering and displaying the thickness of the workpiece 11, and an input field, i.e., a tape thickness input field, 82 for entering and displaying the thickness of the tape 13 affixed to the workpiece 11. For example, the operator enters a character string "ROUND" indicating that the workpiece 11 is of a circular shape as viewed in plan or a character string "SQUARE" indicating that the workpiece 11 is of a rectangular or square shape as viewed in plan into the input field 76. The input field 78 includes an input field, i.e., a diameter input field 78a, for entering and displaying the diameter of the workpiece 11 in case the workpiece 11 is of a circular shape. The input field 78 also includes an input field, i.e., a length input field, 78b for entering and displaying the length of the workpiece 11 and an input field, i.e., a width input field, 78c for entering and displaying the width of the workpiece 11 in case the workpiece 11 is of a rectangular or square shape.

The processing condition setting screen 70 includes in a right area thereof an input field, i.e., a height input field, 84 for entering and displaying a height, i.e., a cutting depth, of the cutting blade 40 with respect to the chuck table 14, i.e., the workpiece 11, an input field, i.e., a speed input field, 86 for entering and displaying a processing feed speed, and an input field, i.e., an index input field, 88 for entering and displaying a spaced interval between areas of the workpiece 11 to be cut by the cutting blade 40, i.e., a spaced interval between adjacent projected dicing lines, or in other, words an index value. The input field 84 includes an input field, i.e., a first height input field, 84a for entering and displaying a height of the cutting blade 40, i.e., a first cutting blade, mounted on the processing unit 38a, and an input field, i.e., a second height input field, 84b for entering and displaying a height of the cutting blade 40, i.e., a second cutting blade, mounted on the processing unit 38b. The input field 88 includes an input field, i.e., a first index input field, 88a for entering and displaying an index value in a first horizontal direction, and an input field, i.e., a second index input field, 88b for entering and displaying an index value in a second horizontal direction perpendicular to the first horizontal direction.

The processing condition setting screen 70 includes an input field, i.e., an automatic down input field, 90, displayed below the input field 88, for entering and displaying conditions for an operation process, i.e., an automatic down process, for automatically reducing the height of the cutting blade 40 while the workpiece 11 is being processed. When the workpiece 11 is processed by the cutting blade 40, the outer circumferential portion of the cutting blade 40 is worn, gradually reducing the diameter of the cutting blade 40. Therefore, the operation process referred to as the automatic down process is carried out to lower the cutting blade 40 depending on the wear of the cutting blade 40 while the workpiece 11 is being processed. The input field 90 enters and displays conditions for the automatic down process.

The input field 90 includes an input field, i.e., a specification length input field, 92a for entering and displaying a reference value, i.e., a specification length, of the distance that the workpiece 11 is to be cut by the cutting blade 40, i.e., the first cutting blade, mounted on the processing unit 38a, and an input field, i.e., a down distance input field, 94a for entering and displaying a distance, i.e., a down distance, by which the first cutting blade is to be lowered with respect to the specification length. The input field 90 also includes an input field, i.e., a specification length input field, 92b for entering and displaying a reference value, i.e., a specification length, of the distance that the workpiece 11 is to be cut by the cutting blade 40, i.e., the second cutting blade, mounted on the processing unit 38b, and an input field, i.e., a down distance input field, 94b for entering and displaying a distance, i.e., a down distance, by which the second cutting blade is to be lowered with respect to the specification length. If the distance that the workpiece 11 is cut by the first cutting blade becomes equal to or larger than the value entered in the input value 92a, the first cutting blade is lowered by the distance, i.e., the down distance, entered in the input field 94a. Similarly, if the distance that the workpiece 11 is cut by the second cutting blade becomes equal to or larger than the value entered in the input field 92b, the second cutting blade is lowered by the distance, i.e., the down distance, entered in the input field 94b.

The processing condition setting screen 70 also includes an input field, i.e., an automatic setup input field, 96, displayed below the input field 90, for entering and displaying conditions for carrying out an automatic setup process. The automatic setup process is an operation process for detecting the amount of wear of the cutting blade 40, i.e., a reduction in the diameter thereof, when the amount by which the workpiece 11 has been cut by the cutting blade 40 has reached a predetermined amount, and adjusting the height of the cutting blade 40 depending on the detected amount of wear of the cutting blade 40.

The input field 96 includes an input field, i.e., a timing input field, 98 for entering and displaying a timing at which the automatic setup process is to be carried out. For example, the operator enters, into the input field 98, a character string "AFTER CUTTING" indicating a mode for allowing the automatic setup process to be carried out at the time when the processing of a workpiece 11 is completed, or a character string "DURING CUTTING" indicating a mode for allowing the automatic setup process to be carried out during the processing of a workpiece 11.

A condition for carrying out the automatic setup process is designated by the distance that the cutting blade 40 has cut the workpiece 11, or the number of lines, i.e., the number of cut lines, along which the cutting blade 40 has cut the workpiece 11. Specifically, the input field 96 includes an input field, i.e., a cut distance input field, 100*a* for entering and displaying a reference value of the cut distance by the cutting blade 40, i.e., the first cutting blade, mounted on the processing unit 38*a*, and an input field, i.e., a number-of-cut-lines input field, 102*a* for entering and displaying a reference value of the number of lines cut by the first cutting blade. The input field 96 further includes an input field, i.e., a cut distance input field, 100*b* for entering and displaying a reference value of the cut distance by the cutting blade 40, i.e., the second cutting blade, mounted on the processing unit 38*b*, and an input field, i.e., a number-of-cut-lines input field, 102*b* for entering and displaying a reference value of the number of lines cut by the second cutting blade.

If the timing entered in the input field 98*a* arrives when the cut distance by the first cutting blade is equal to or larger than the cut distance already entered in the input field 100*a*, or the number of lines cut by the first cutting blade is equal to or larger than the number of cut lines already entered in the input field 102*a*, during the workpiece 11 cut by the first cutting blade, then the automatic setup process for the first cutting blade is carried out. Specifically, the amount of wear, i.e., a reduction in the diameter, of the first cutting blade is detected, and the height of the first cutting blade is changed depending on the detected amount of wear. The changed height of the first cutting blade is entered into the input field 84*a*. The automatic setup process for the second cutting blade is similarly carried out. The detection of the amount of wear of the cutting blade 40 is not limited to any particular method. The processing apparatus 2 has a detector such as a transmissive photoelectric sensor, for example, and the amount of wear of the cutting blade 40, i.e., a reduction in the diameter thereof, is detected using the detector. Furthermore, the height of the cutting blade 40 that has been changed may be automatically set depending on the amount of wear of the cutting blade 40 or may be manually set by the operator depending on the amount of wear of the cutting blade 40.

During the processing of the workpiece 11, only one of the automatic down process and the automatic setup process may be carried out or both of them may be carried out. If the automatic down process and the automatic setup process are used in combination with each other, then the distance that the cutting blade 40 is lowered is appropriately adjusted on the basis of the actual amount of wear of the cutting blade 40 by the automatic setup process, and the time required for the automatic setup process is shortened by the automatic down process.

The processing condition setting screen 70 also includes an input section 110 below the automatic setup input field 96. The input section 110 is used to enter information into various input fields included in the processing condition setting screen 70. The input section 110 includes an input field, i.e., an information input field, 112 for entering and displaying information represented by a numerical value, a character string, or the like, and an operation field 114 for entering information into the various input fields included in the processing condition setting screen 70. The operation field 114 includes a plurality of input keys 116 for entering information. FIG. 2 illustrates a ten-key pad displayed in the operation field 114, for entering numerical values into the input fields. When one of the input fields included in the processing condition setting screen 70 is selected, i.e., is rendered active, the operator operates the operation field 114 to enter a desired numerical value into the active input field.

The input section 110 includes, near the input section 110, a switching key 118 for switching between different display modes in the operation field 114. When the switching key 118 is selected, the operation field 114 switches from the ten-key pad to a keyboard in display. The operation field 114 now allows the operator to enter a character string such as that of alphabet. In case the ten-key pad is displayed in the operation field 114, the input section 110 also functions as a calculator for performing four arithmetic operations. Specifically, when the operator operates input keys 116 in the operation field 114 while numerical values are being entered in the input field 112, a desired one of the four arithmetic operations is carried out on the numerical values entered in the input field 112.

The input section 110 includes, in a left portion thereof, a clipboard area 120 for storing and displaying desired information. The clipboard area 120 includes a plurality of buffer areas 122 where the information represented by numerical values, character strings, or the like entered in the input field 112 is copied and stocked. A specific example of how to use the buffer areas 122 will be described later.

The processing condition setting screen 70 includes, in its right end portion, an enter key 130 and an exit key 132. The enter key 130 is a processing key for performing a process for finalizing the information entered in each of the input fields. The exit key 132 is a processing key for finalizing all the information entered in the processing condition setting screen 70 and closing the processing condition setting screen 70.

For setting processing conditions for the processing apparatus 2, the touch panel 52 displays the processing condition setting screen 70, and the operator operates the displayed processing condition setting screen 70. The operator operates the processing condition setting screen 70 by touching the touch panel 52. For example, when the operator taps an area of the touch panel 52 where an input field or a key is displayed, the input field or the key is selected.

For entering information into one of the input fields included in the operator operates the processing condition setting screen 70, the operator selects the input field to render it active, and enters a numerical value or a character string with the input keys 116 of the operation field 114. In case the input keys 116 are closely positioned at small spaced intervals, for example, the operator tends to make input mistakes. In addition, in case the number of digits representing a numerical value to be entered or the number of characters of a character string to be entered is large, the operator may enter wrong information. Moreover, when processing conditions are to be set, identical values or character strings may be entered into a plurality of input fields. For example, in case identical conditions are to be set for the automatic down process and the automatic setup process with respect to the pair of cutting blades 40 mounted in the processing apparatus 2, identical values are entered into each pair of the input fields 91*a* and 91*b*, the input fields 94*a* and 94*b*, the input fields 100*a* and 100*b*, and the input fields 102*a* and 102*b*. Furthermore, in case processing feed speeds for a plurality of processing conditions are to be changed similarly, for example, it is necessary to repeatedly enter a given processing feed speed repeatedly for all the processing conditions. If the operator enters the same information into a plurality of input fields using the input keys 116 of the operation field 114, then the operator is likely to find the input process tedious and time-consuming.

With the processing apparatus 2 according to the present embodiment, when one input field is selected, a copy processing key and a paste processing key are displayed around the selected input field. The operator then operates the copy processing key and the paste processing key to enter information into the selected input field without using the input keys 116 of the operation field 114. In this manner, processing conditions are entered into the input field simply and accurately, and the frequency of entering information using the input keys 116 is reduced.

Figure 3:
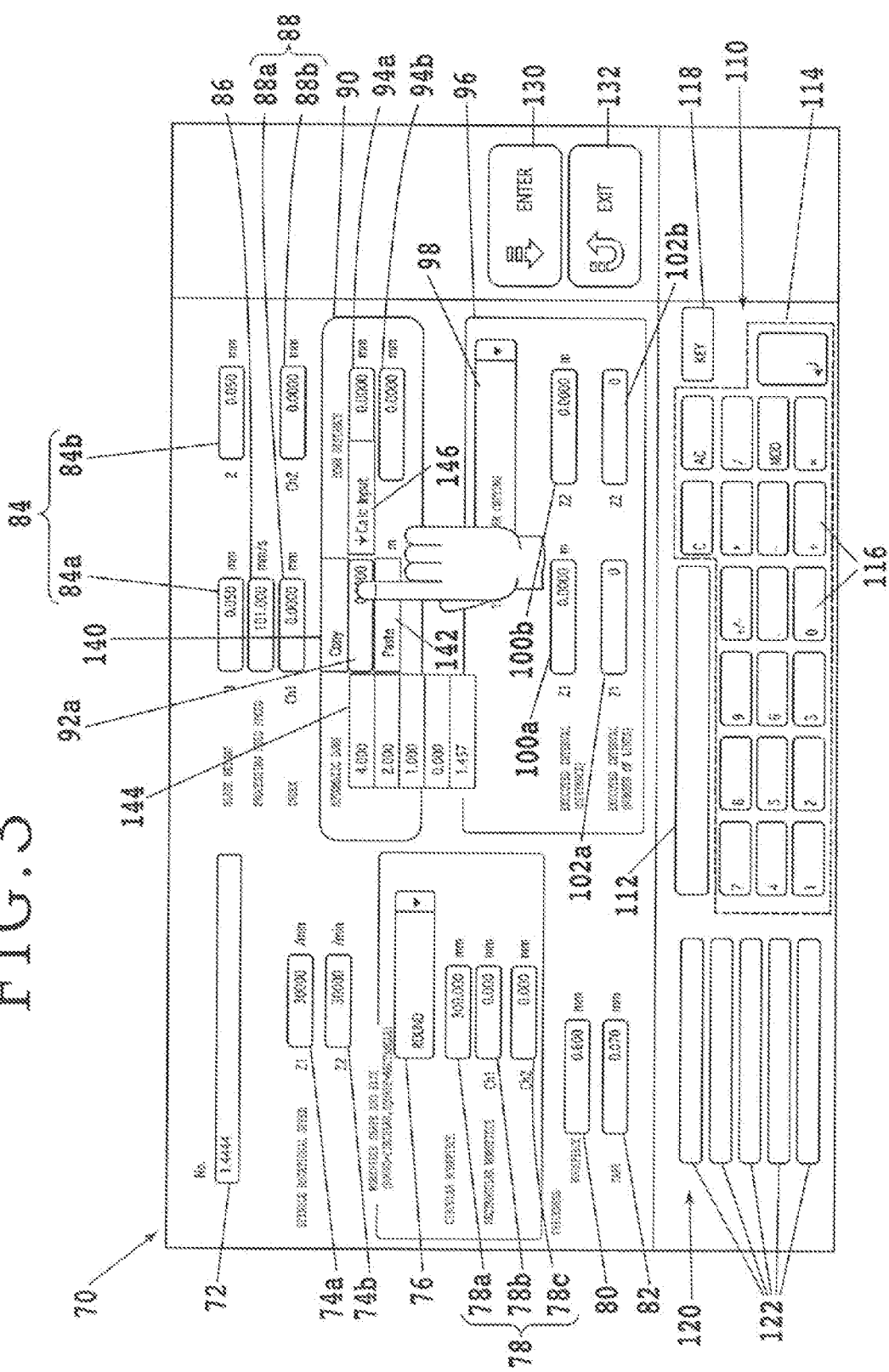
FIG. 3 is a view of the processing condition setting screen at the time an input field is selected.

FIG. 3 illustrates the processing condition setting screen 70 at the time an input field is selected. In FIG. 3, the input field 92a for entering and displaying a specification length for the automatic down process is illustrated as being selected.

When the operator taps an area of the touch panel 52 where the input field 92a is displayed, the input field 92a is selected and rendered active, allowing a numerical value to be entered into the input field 92a. While the input field 92a is being selected, the operator taps some of the input keys 116 of the operation field 114 displayed in the lower portion of the processing condition setting screen 70, entering a desired numerical value into the input field 92a.

On the other hand, when the operator keeps on touching, i.e., long pressing or long touching, the area of the touch panel 52 where the input field 92a is displayed, a copy processing key 140, a paste processing key, i.e., an affix processing key, 142, a plurality of history transcription processing keys 144, and a transcription processing key 146 are displayed around the input field 92a. For example, as illustrated in FIG. 3, the copy processing key 140 is displayed above the input field 92a, the paste processing key 142 is displayed below the input field 92a, the plurality of history transcription processing keys 144 are displayed on the left side of the input field 92a, and the transcription processing key 146 is displayed on the right side of the input field 92a, all adjacent to the input field 92a. The displaying of the copy processing key 140, the paste processing key 142, the history transcription processing keys 144, and the transcription processing key 146 is not limited to any particular method. These keys may be displayed when the operator taps or double-taps the area of the touch panel 52 where the input field 92a is displayed, for example. The copy processing key 140, the paste processing key 142, the history transcription processing keys 144, and the transcription processing key 146 may be displayed in a color different from the background color of the processing condition setting screen 70 or the color of the input field 92a. The differently colored keys are displayed in highlight.

The copy processing key 140 is an execution key for carrying out a process for copying information, i.e., data, entered in an input field and temporarily storing the information. Specifically, when the copy processing key 140 is selected, a numerical value entered in the input field 92a that is active is copied and temporarily stored. The paste processing key 142 is an execution key for carrying out a process for entering, i.e., pasting, information, i.e., data, copied and temporarily stored by selecting the copy processing key 140, into an input field. Specifically, when the paste processing key 142 is selected, in case a numerical value entered in the input field 92b has been copied by selecting the copy processing key 140, the numerical value entered in the input field 92b is entered into the input field 92a. In case shared information is to be entered into a plurality of input fields, the information from an input field is copied by selecting the copy processing key 140, another input field is rendered active, and the paste processing key 142 is selected, entering the copied information into the active input field. In this manner, the frequency of entering the information using the input keys 116 of the operation field 114 is reduced. As a result, the process of entering information is simplified, and the operator is less likely to make input mistakes.

Each of the history transcription processing keys 144 displays information, i.e., history information or history data, that has been entered in a selected input field. In FIG. 3, five history transcription processing keys 144 are illustrated by way of example as displaying respective numerical values that have been entered in the input field 92a. The five history transcription processing keys 144 are arrayed vertically in the processing condition setting screen 70, for example, with newer history information displayed in upper history transcription processing keys. Each of the history transcription processing keys 144 is an execution key for carrying out a process for entering information displayed therein into an input field. Specifically, when one of the history transcription processing keys 144 is selected, the information displayed in the selected history transcription processing key 144 is entered into the active input field 92a. Using the history transcription processing keys 144, the operator can enter a numerical value once entered in the input field 92a into the input field 92a again without operating the input key 116 of the operation field 114. Consequently, the operator can simply and reliably restore the numerical value of a specification length that has been changed, for example. The number of history transcription processing keys displayed around a selected input field is not limited, and may be set to any value equal to or larger than one.

The transcription processing key 146 is an execution key for carrying out a process for entering information, i.e., data, entered in a selected input field into another input field. Specifically, when the transcription processing key 146 is selected, a numerical value entered in the active input field 92a is entered into, i.e., transcribed to, another input field that is selected. By selecting the transcription processing key 146, the operator can copy the numerical value entered in the active input field 92a to another input field without operating the input keys 116 of the input section 110 or selecting the copy processing key 140 and the paste processing key 142. In this manner, the process of entering information is simplified, and the operator is less likely to make input mistakes. An example in which the transcription processing key 146 is an execution key for carrying out a process for entering information entered in an active input field into the input field 112 in the input section 110 will be described below.

The input field 92a has been selected by way of example as described above. However, in case another input field included in the processing condition setting screen 70 is selected, the copy processing key 140, the paste processing key 142, the history transcription processing keys 144, and the transcription processing key 146 are similarly displayed around the selected input field. Accordingly, a copying process, a pasting process, and a history transcribing process can be performed on information entered in any desired input fields, and information entered in any desired input fields can be transferred to another input field.

The selection of the copy processing key 140, the paste processing key 142, the history transcription processing keys 144, and the transcription processing key 146 is not limited to any particular method. While the copy processing key 140, the paste processing key 142, the history transcription processing keys 144, and the transcription processing key 146 are being displayed, the operator may tap one of the keys to select the key. After having displayed the copy processing key 140, the paste processing key 142, the history transcription processing keys 144, and the transcription processing key 146 by long pressing an input field, the operator may select one of the keys by a flicking action to keep the finger in contact with the touch panel 52 and slide the finger toward the key to be selected. The flicking action allows the operator to select a desired key quickly with a less chance of making selection mistakes.

In case a numerical value has been transcribed to the input field 112 in the input section 110, the operator can perform four arithmetic operations on the numerical value. Specifically, the input section 110 also functions as a calculator. When the operator operates some of the input keys 116 displayed in the operation field 114, the operator can perform a desired arithmetic operation on the numerical value entered in the input field 112. For example, when the operator successively performs a process for transcribing the thickness of the workpiece 11 entered in the input field 80 to the input field 112 by selecting the transcription processing key 146, a process for selecting one of the input keys 116 that execute an addition, and a process of transcribing the thickness of the tape 13 entered in the input field 82 to the input field 112 by selecting the transcription processing key 146, the thickness of the workpiece 11 and the thickness of the tape 13 are added to each other, and the result is displayed in the input field 112. The operator may alternatively enter desired numerical values directly into the input field 112. When the operator touches an area of the touch panel 52 where the input field 112 is displayed, the input field 112 is selected and rendered active, so that a numerical value can be entered into the input field 112. Then, the operator operates some of the input keys 116 of the operation field 114 to enter a desired numerical value into the input field 112.

Figure 4:
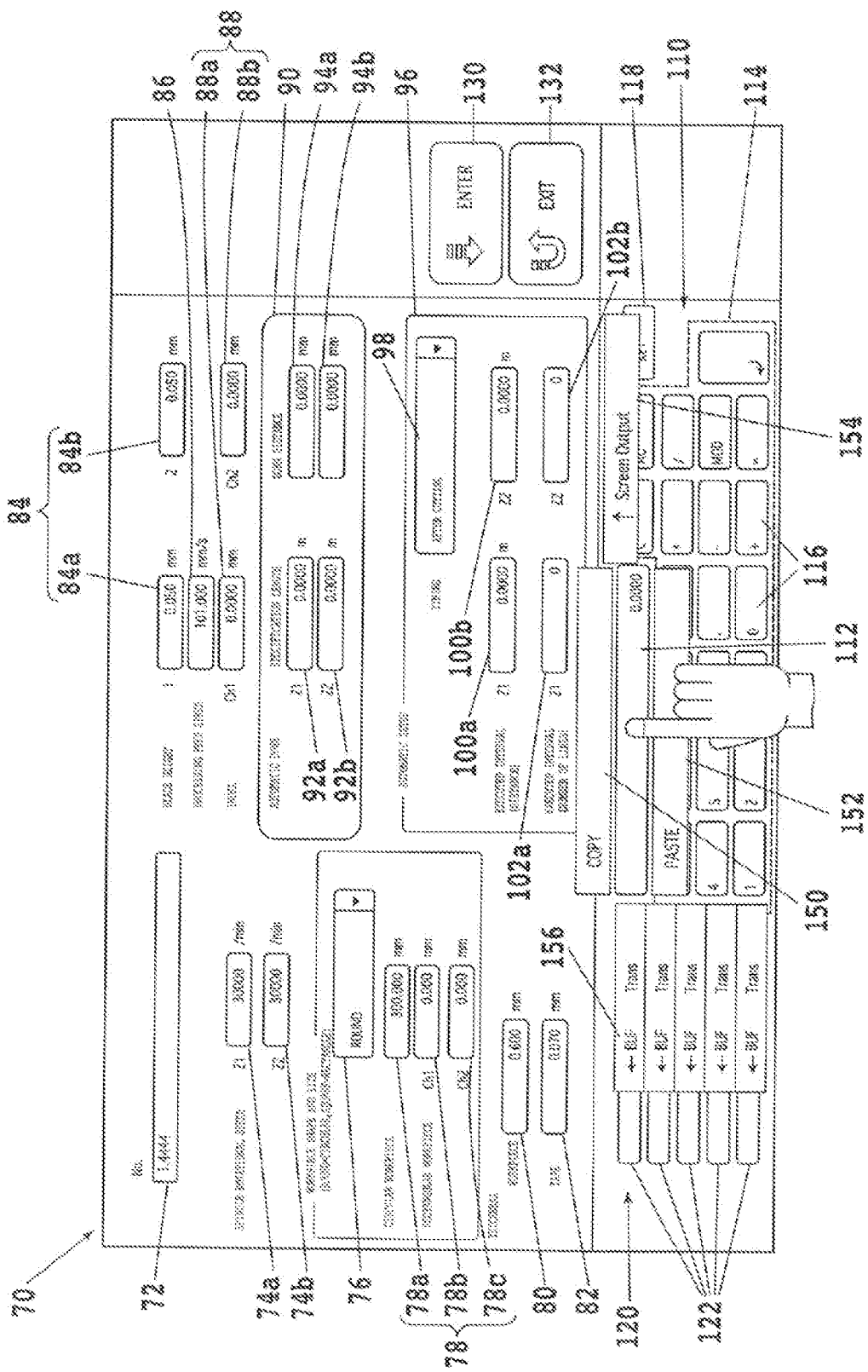
FIG. 4 is a view of the processing condition setting screen at the time an input field in an input section is selected.

FIG. 4 illustrates the processing condition setting screen 70 at the time the input field 112 in the input section 110 is selected. When the operator keeps on touching, i.e., long pressing, the area of the touch panel 52 where the input field 112 is displayed, for a certain time, a copy processing key 150, a paste processing key, i.e., an affix processing key, 152, a transcription processing key 154, and a plurality of buffer transcription processing keys 156 are displayed around the input field 112. For example, as illustrated in FIG. 4, the copy processing key 150 is displayed above the input field 112, the paste processing key 152 is displayed below the input field 112, the transcription processing key 154 is displayed on the right side of the input field 112, and the buffer transcription processing keys 156 are displayed on the left side of the input field 112, all adjacent to the input field 112. The displaying of the copy processing key 150, the paste processing key 152, the transcription processing key 154, and the buffer transcription processing keys 156 is not limited to any particular method. These keys may be displayed when the operator taps or double-taps the area of the touch panel 52 where the input field 112 is displayed, for example. The copy processing key 150, the paste processing key 152, the transcription processing key 154, and the buffer transcription processing keys 156 may be displayed in a color different from the background color of the processing condition setting screen 70 or the color of the input field 112. The differently colored keys are displayed in highlight.

The copy processing key 150 and the paste processing key 152 have the same functions as the copy processing key 140 and the paste processing key 142 illustrated in FIG. 3. Specifically, when the copy processing key 150 is selected, information entered in the input field 112 is copied. When the paste processing key 152 is selected, information that has been copied in advance is entered into the input field 112. The transcription processing key 154 has the same function as the transcription processing key 146 illustrated in FIG. 3. Specifically, when the transcription processing key 154 is selected, information entered in the input field 112 is entered into, i.e., transcribed to, another input field that is selected. An input field as a destination to which information is to be transcribed by selecting the transcription processing key 154 may freely be selected. For example, in case a numerical value entered in the input field 112 is to be transcribed to the input field 92*a*, the operator taps the input field 92*a* to designate the input field 92*a* as a destination. Thereafter, the operator displays and selects the transcription processing key 154, and the numerical value entered in the input field 112 is transcribed to the input field 92*a*.

Each of the buffer transcription processing keys 156 is an execution key for carrying out a process for transferring information, i.e., data, entered in the input field 112 to one of the buffer areas 122. As many buffer transcription processing keys 156 as the number of the buffer areas 122, i.e., five buffer transcription processing keys 156 in FIG. 4, are displayed at respective positions overlapping or adjacent to the buffer areas 122.

When one of the buffer transcription processing keys 156 is selected, information entered in the input field 112 is transcribed to and displayed in the buffer area 122 corresponding to the selected buffer transcription processing key 156. In this fashion, numerical values, character strings, or the like that are used highly frequently are retained in the buffer areas 122. When the operator long presses one of the buffer areas 122, the copy processing key 150 and the paste processing key 152 are displayed around the long-pressed buffer area 122. Therefore, information entered in the buffer area 122 can be transcribed to another desired input field by a copying process and a pasting process. The transcription of information from the buffer areas 122 is not limited to any particular method. The operator may select an input field as a destination to which information entered in one of the buffer areas 122 is to be transcribed, and then may long-press the buffer area 122 to transcribe the information from the buffer area 122 to the input field as the destination. With the plurality of buffer areas 122 included in the clipboard area 120 for stocking desired information therein, as described above, it is possible to enter numerical values, character strings, or the like that are used highly frequently from the buffer areas 122 quickly into other input fields.

Figure 5:
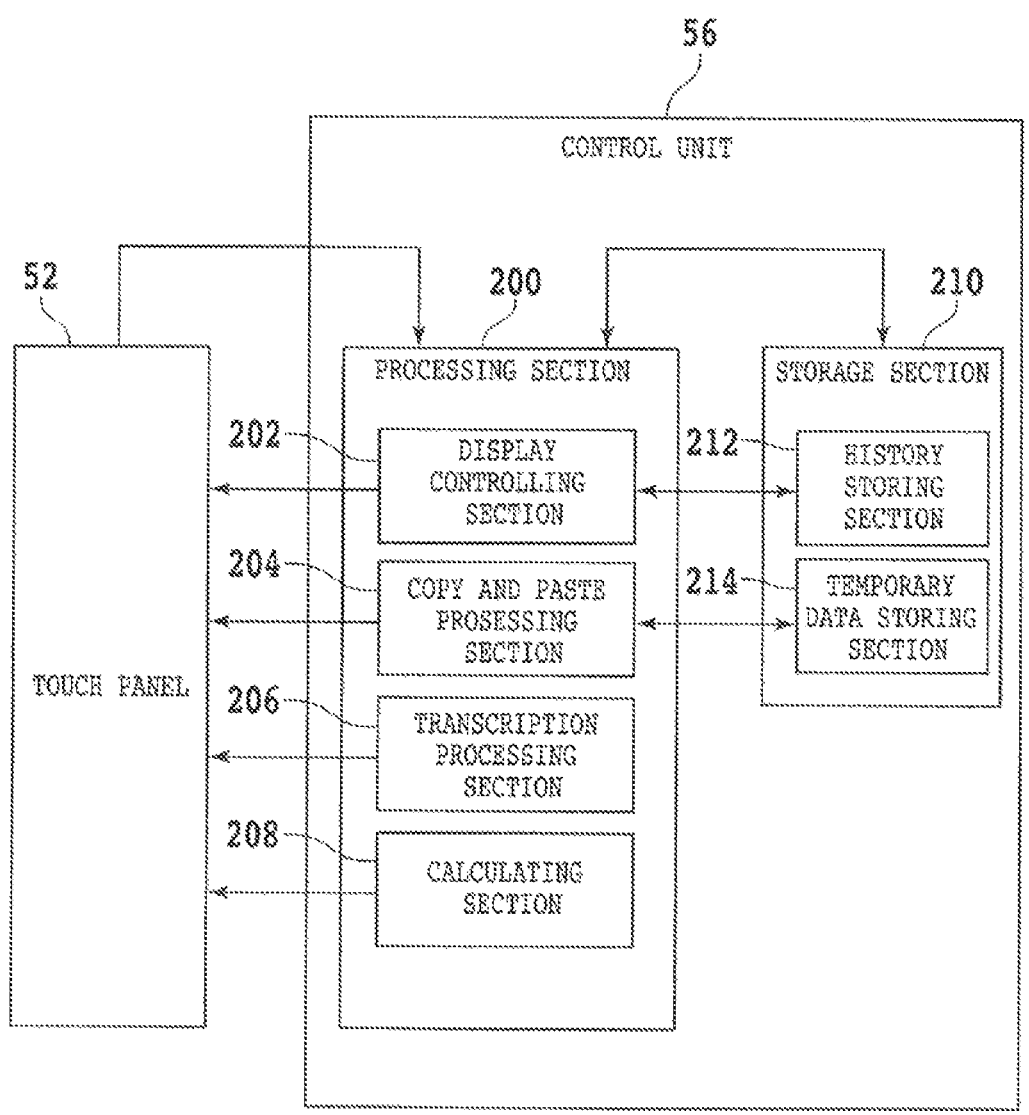
FIG. 5 is a block diagram of a configurational example of a control unit of the processing apparatus.

The processing condition setting screen 70 displayed on the touch panel 52 is controlled by the control unit 56 (see FIG. 1) of the processing apparatus 2. FIG. 5 is a block diagram of a configurational example of the control unit 56 of the processing apparatus 2. The control unit 56 includes a processing section 200 for performing processing sequences such as arithmetic operations required to control the processing apparatus 2, and a storage section 210 for storing various data, programs, etc. used in the processing sequences performed by the processing section 200. The processing section 200 includes a processor such as a central processing unit (CPU), for example, whereas the storage section 210 includes a memory such as a random access memory (RAM). The processing section 200 and the storage section 210 are connected to each other by a bus.

FIG. 5 illustrates a functional configuration of the processing section 200 and the storage section 210. Specifically, the processing section 200 includes a display controlling section 202 for controlling displaying of the touch panel 52, a copy and paste processing section 204 for performing a copying process and a pasting process on the processing condition setting screen 70 (see FIGS. 2, 3, and 4) displayed on the touch panel 52, a transcription processing section 206 for performing a process for transcribing information on the processing condition setting screen 70, and a calculating section 208 for performing arithmetic operations, i.e., four arithmetic operations by a calculator, in the input section 110 included in the processing condition setting screen 70. The storage section 210 includes a history storing section 212 for storing information, i.e., data, previously entered in the input fields included in the processing condition setting screen 70, and a temporary data storing section 214 for temporarily storing information, i.e., data, copied on the processing condition setting screen 70.

A specific example of operation of the control unit 56 will hereinafter be described below. Particularly, an example of operation in which the copy processing key 140, the paste processing key 142, the history transcription processing keys 144, and the transcription processing key 146 illustrated in FIG. 3 and the copy processing key 150, the paste processing key 152, the transcription processing key 154, and the buffer transcription processing keys 156 illustrated in FIG. 4 are selected will be described in detail below.

For setting processing conditions for the processing apparatus 2, the display controlling section 202 controls the touch panel 52 to display the processing condition setting screen 70. When one of the input fields, e.g., the input field 92a (see FIG. 3), included in the processing condition setting screen 70 is long pressed, the display controlling section 202 controls the touch panel 52 to display the copy processing key 140, the paste processing key 142, the history transcription processing keys 144, and the transcription processing key 146 around the input field 92a. The information, i.e., the history information, displayed in the respective history transcription processing keys 144 has been stored beforehand in the history storing section 212 in the storage section 210. The display controlling section 202 accesses the history storing section 212, reads the history information therefrom, and displays the history information in the respective history transcription processing keys 144.

When the copy processing key 140 is selected on the processing condition setting screen 70, the data, i.e., the numeral value, entered in the input field 92a is copied and entered into the copy and paste processing section 204. The copy and paste processing section 204 accesses the temporary data storing section 214 and stores the data in the temporary data storing section 214. When the paste processing key 142 is selected on the processing condition setting screen 70, the copy and paste processing section 204 accesses the temporary data storing section 214 and reads the copied data from the temporary data storing section 214. Then, the copy and paste processing section 204 enters the read data into the input field 92a.

When one of the history transcription processing keys 144 is selected on the processing condition setting screen 70, the transcription processing section 206 performs a process for entering the information displayed in the selected history transcription processing key 144 into the input field 92a. When the transcription processing key 146 is selected on the processing condition setting screen 70, the transcription processing section 206 performs a process for entering the information entered in the input field 92a into, i.e., transcribing the information entered in the input field 92a to, another input field, e.g., the input field 112 in the input section 110.

For performing four arithmetic operations on the numerical value entered in the input field 112, the operator operates some of the input keys 116 included in the operation field 114 in the input section 110 to designate a specific arithmetic operation. The calculating section 208 performs a process for carrying out the designated arithmetic operation and entering the result into the input field 112.

When the input field 112 in the input section 110 is long pressed, the display controlling section 202 controls the touch panel 52 to display the copy processing key 150, the paste processing key 152, the transcription processing key 154, and the buffer transcription processing keys 156 around the input field 112 (see FIG. 4). When the copy processing key 150 is selected on the processing condition setting screen 70, the data, i.e., the numerical value, entered in the input field 112 is copied and entered into the copy and paste processing section 204. The copy and paste processing section 204 accesses the temporary data storing section 214 and stores the data in the temporary data storing section 214. When the paste processing key 152 is selected on the processing condition setting screen 70, the copy and paste processing section 204 accesses the temporary data storing section 214 and reads the copied data from the temporary data storing section 214. Then, the copy and paste processing section 204 enters the read data into the input field 112.

When the transcription processing key 154 is selected on the processing condition setting screen 70, the transcription processing section 206 performs a process for entering the information entered in the input field 112 into, i.e., transcribing the information entered in the input field 112 to, another input field. The input field as a destination to which the information is to be transcribed is designated by the operator. When one of the buffer transcription processing keys 156 is selected on the processing condition setting screen 70, the transcription processing section 206 performs a process for entering the information entered in the input field 112 into the buffer area 122 that corresponds to the selected buffer transcription processing key 156.

When one of the buffer areas 122 is long pressed and selected, the display controlling section 202 displays the copy processing key 150 and the paste processing key 152 around the selected buffer area 122. When the copy processing key 150 or the paste processing key 152 is selected, the copy and paste processing section 204 performs the copying process or the pasting process as described above.

After desired information has been entered into all the input fields included in the processing condition setting screen 70, the operator selects the end key 132. The processing conditions are now finalized, and the display controlling section 202 closes the processing condition setting screen 70. Thereafter, the processing section 200 controls operation of the various components of the processing apparatus 2 according to the finalized processing conditions.

It has been described above that the information entered in the input field 92a is transcribed to the input field 112 in the input section 110 when the transcription processing key 146 is selected. However, the information entered in the input field 92a may be transcribed by selecting the copy processing key 140 (see FIG. 3) and the paste processing key 152 (see FIG. 4). Specifically, after the copy processing key 140 has been selected with the input field 92a selected, the paste processing key 152 is selected with the input field 112 selected in the input section 110. The information entered in the input field 92a is thus entered into the input field 112.

As described above, with the processing apparatus 2 according to the present embodiment, when one of the input fields displayed on the touch panel is selected, the copy processing key and the paste processing key are displayed around the selected input field. When the copy processing key and the paste processing key are selected, information is entered into the input field by the copying process and the pasting process, rather than using the input keys 116 in the operation field 114. Accordingly, processing conditions are simply and accurately entered into the processing apparatus 2.

According to the present embodiment, the processing apparatus 2 has been illustrated and described as a cutting apparatus having the processing units 38a and 38b, i.e., the cutting units, for cutting a workpiece 11. However, the processing apparatus 2 is not limited to any particular kind. The processing apparatus 2 may be a grinding apparatus having a processing unit, i.e., a grinding unit, for grinding a workpiece 11 with a grinding wheel having a plurality of fixed grinding stones, a polishing apparatus having a processing unit, i.e., a polishing unit, for polishing a workpiece 11 with a polishing pad, a laser processing apparatus having a processing unit, i.e., a laser beam applying unit, for processing a workpiece 11 with a laser beam applied thereto, or the like.

In case the processing apparatus 2 is a grinding apparatus, the touch panel 52 displays a processing condition setting screen for entering various items included in processing conditions for a grinding process, e.g., a target value, i.e., a finished thickness, for the thickness of a workpiece 11, the rotational speed of the grinding wheel, the rotational speed of the chuck table, the speed at which the grinding wheel is lowered, i.e., the speed at which the grinding wheel is pressed against the workpiece 11, the rate at which a processing fluid is to be supplied to the workpiece 11, the temperature of the processing fluid, and so on. In case the processing apparatus 2 is a polishing apparatus, the touch panel 52 displays a processing condition setting screen for entering various items included in processing conditions for a polishing process, e.g., a target value, i.e., a finished thickness, for the thickness of a workpiece 11, the rotational speed of the polishing pad, the rotational speed of the chuck table, the speed at which the polishing pad is lowered, i.e., the speed at which the polishing pad is pressed against the workpiece 11, the rate at which a processing fluid is supplied to the workpiece 11, the temperature of the processing fluid, and so on. In case the processing apparatus 2 is a laser processing apparatus, the touch panel 52 displays a processing condition setting screen for entering various items included in processing conditions for a laser processing process, e.g., conditions for applying a laser beam including a wavelength, a power level, a spot diameter, a repetitive frequency, the position of a focused spot, etc., a processing feed speed, a processing feed direction, and so on.

The configurational and functional details of the above embodiment can be changed and modified without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising: a chuck table for holding a workpiece; a processing unit for processing the workpiece held on the chuck table; a touch panel for entering processing conditions; and a control unit for controlling the touch panel, wherein the control unit comprises a memory, and wherein the control unit is programmed to: display on the touch panel a plurality of input fields corresponding to a plurality of items included in the processing conditions, display on the touch panel a copy processing key, a paste processing key, and a transcription processing key in response to one of the input fields being selected, enter information from the selected one of the input fields into another one of the input fields in response to the transcription processing key and the another one of the input fields being selected without selecting the copy processing key and the paste processing key.

2. The processing apparatus according to claim 1, wherein the control unit is programmed to display on the touch panel an input section including a plurality of input keys used to enter information into the plurality of input fields and an information input field, the input section also functioning as a calculator, and wherein the display of the copy processing key, the paste processing key, and the transcription processing key further comprises copy the information from the selected one of the input fields when the copy processing key is selected.

3. The processing apparatus according to claim 1, wherein the control unit is programmed to display on the touch panel an input section including a plurality of input keys used to enter information into the plurality of input fields and an information input field, the input section also functioning as a calculator, wherein the selected another one of the input fields is the information input field.

4. The processing apparatus according to claim 1, wherein the display of the copy processing key, the paste processing key, and the transcription processing key further comprising displaying one or more history transcription processing keys, wherein the one or more history transcription processing keys display information previously entered in the selected one of the input fields, and when one of the one or more history transcription processing keys is selected, enter information displayed in the selected one of the one or more history transcription processing keys into a third selected one of the input fields.

5. The processing apparatus according to claim 1, wherein the transcription processing key is selected by a flicking action.

\* \* \* \* \*